United States Patent [19]
Aisenberg

[11] 3,961,103
[45] June 1, 1976

[54] FILM DEPOSITION

[75] Inventor: Sol Aisenberg, Natick, Mass.

[73] Assignee: Space Sciences, Inc., Waltham, Mass.

[22] Filed: Nov. 7, 1974

[21] Appl. No.: 521,838

Related U.S. Application Data

[60] Division of Ser. No. 271,014, July 12, 1972, Pat. No. 3,909,505, which is a continuation of Ser. No. 21,282, March 20, 1970, abandoned.

[52] U.S. Cl. .................................. 427/39; 427/34; 427/41; 204/298; 219/121 EB; 423/446
[51] Int. Cl.² .......................................... C23C 11/00
[58] Field of Search ............ 204/298; 219/121 EP; 427/38, 39, 40, 41, 35, 47, 34; 423/446

[56] References Cited
UNITED STATES PATENTS

| | | | |
|---|---|---|---|
| 3,117,022 | 1/1964 | Bronson et al. ...................... 204/192 |
| 3,294,583 | 12/1966 | Fedows-Fedotowsky ......... 427/47 X |
| 3,297,465 | 1/1967 | Connell et al. ........................ 427/39 |
| 3,303,319 | 2/1967 | Steigerwald .................. 219/121 EB |
| 3,494,852 | 2/1970 | Doctoroff ............................ 204/298 |
| 3,534,385 | 10/1970 | Castaing et al. ................. 204/298 X |
| 3,751,310 | 8/1973 | Cho ................................. 204/192 X |

*Primary Examiner*—Ralph S. Kendall
*Attorney, Agent, or Firm*—Richard J. Birch

[57] ABSTRACT

A method and apparatus for depositing a thin film of material upon a base substrate including a glow discharge ion source for generating the particular ions that will be subsequently deposited upon the base substrate, a vacuum deposition chamber wherein the substrate material is located, and, intermediate between the glow discharge ion source and the vacuum deposition chamber, a constrictor electrode for isolating the deposition chamber from the ion chamber and an anode electrode for extracting ions from the glow discharge ion source and directing them toward the target substrate. A magnetic field is also provided in the apparatus of the present invention by the use of an externally wound magnetic coil to permit the glow discharge ion source to operate at a lower pressure and to constrict the flow of ions toward the substrate.

22 Claims, 2 Drawing Figures

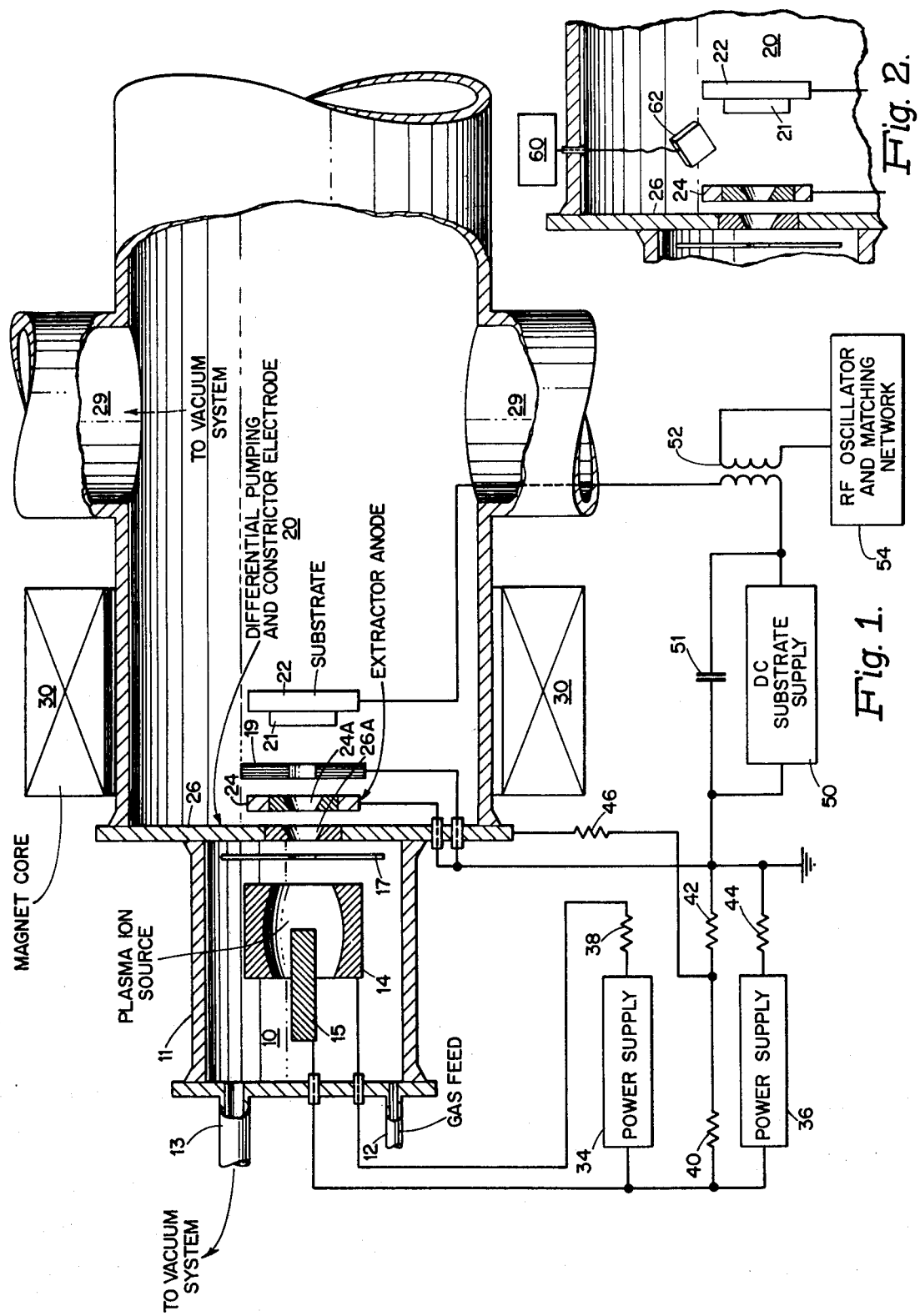

FILM DEPOSITION

CROSS-REFERENCE TO RELATED APPLICATION

This application is a division of application Ser. No. 271,014 filed July 12, 1972, which is now U.S. Pat. No. 3,904,505, issued Sept. 9, 1975, which in turn is a continuation application of my previously filed application, Ser. No. 21,282 filed March 20, 1970, abandoned, for FILM DEPOSITION.

BACKGROUND OF THE INVENTION

The present invention relates to a method and apparatus for providing improved thin film deposition.

There have been numerous techniques employed for depositing thin films, most of which involve the use of a substrate, which is elevated to or maintained at a relatively high temperature. This high substrate temperature has been considered necessary during the deposition of the thin film for the purpose of increasing the mobility of the atoms being deposited. However, this high temperature substrate has certain problems associated with it. For example, one disadvantage of vapor deposition upon a hot substrate is that the impurities are caused to diffuse out from the substrate and thereby affect the composition of the thin film that is being deposited. Further, the excess temperatures cause a poor definition at the junction between the film and the base substrate material.

It is known that the necessary substrate atom mobility is obtained by heating the incident ions that are to be deposited on the substrate surface rather than the substrate itself. The apparatus of the present invention takes this fact into account and permits less heating of the substrate by isolating the substrate within a separate chamber adjacent to the plasma ion source chamber. Further, the apparatus is designed to control the energy of impinging ions by appropriate biasing means coupled to the substrate material.

It is an object of the present invention, therefore, to provide an improved method and means for the deposition of thin films.

It is another object of the present invention to provide film deposition apparatus wherein the substrate can be maintained at a relatively low temperature.

A further object of this invention is to provide a method for fabricating a thin film-substrate structure wherein the film can be deposited at a high rate and in a controllable manner.

Another object of the present invention is to provide a thin film upon a base substrate wherein there has been little or no impurity diffusion from the substrate affecting the thin film deposited thereon.

Still another object of the present invention is to provide a thin film-substrate structure wherein the junction between the two substances is well defined.

Other objects of the present invention will become apparent upon reading the detailed description in conjunction with the drawings and appended claims.

SUMMARY OF THE INVENTION

One embodiment of the apparatus of the present invention provides a means by which the thin film is formed on a substrate by ionizing and electrostatically accelerating a beam of atomic particles of a material which is to be deposited on the substrate as a thin film. A plasma ion source acts as such a source of atoms of the material to be deposited. An electrical discharge occurs within this source of ions, and the desired material is converted into a plasma form with the ions to be deposited in a mixture with high energy electrons. An axial magnetic field may be used to constrain the orbits of the electrons and increase their likelihood of ionizing atoms of the material under consideration. This magnetic field permits the electrical discharge to operate at a lower gas pressure than could be used without the magnetic field. Thus, in the source discharge chamber, there is a plasma which contains a large concentration of ions of the species that are to be subsequently deposited.

A plasma discharge from this plasma ion source is generated into a vacuum deposition chamber where the substrate material is located. This can be accomplished by locating an extraction electrode in the vacuum deposition chamber and by the use of a constrictor means separating the higher pressure plasma ion chamber from the lower pressure vacuum deposition chamber. The ions are extracted through an aperture in the constrictor by means of the applied electric field which maintains a discharge between the plasma source, which functions as a cathode, and the extraction electrode, which is situated in the vacuum deposition chamber. The purpose of the constrictor means is to isolate the vacuum deposition chamber from the higher pressures present in the plasma ion chamber while the extractor electrode pulls the positive ions within the plasma source toward the target substrate. It is often desirable to surround the constrictor aperture with the same material as that to be deposited on the substrate.

In another embodiment of the invention the accelerated beam may be of an inert gas and the ions to be deposited may be supplied by an auxilliary source within the deposition chamber. The beam provides the energy necessary to deposit the ions from the source which co-impinge with the ion beam.

BRIEF DESCRIPTION OF THE DRAWINGS

These and other objects and advantages of the present invention will be more clearly understood when considered in conjunction with the accompanying drawings in which:

FIG. 1 is a cross-sectional diagram of one embodiment of the deposition system according to the invention.

FIG. 2 is a cross-sectional view of part of another embodiment of the deposition system similar to that shown in FIG. 1.

DETAILED DESCRIPTION

As hereinbefore mentioned, the present invention permits the deposition of improved thin films by means of an ion beam source used in conjunction with a vacuum deposition chamber. FIG. 1 shows an embodiment for practicing the present invention. In one particular system, a silicon film 21 is deposited on a single crystal silicon substrate 22. The film 21 is shown in an exaggerated thickness in FIG. 1.

Plasma ion source 10 generally includes chamber structure 11 having vacuum line 13 and gas input line 12 connected thereto. Vacuum line 13 connects to a vacuum pump (not shown) which controls the pressure in source 10. Also included in ion source 10 are silicon electrodes 14 and 15, which connect externally to power supply 34 and resistor 38. With an electrical discharge taking place within plasma ion source 10, the material which is silicon in this particular case, is introduced into a plasma formed by the high energy electrons. A magnetic field set up by magnetic coil 30 influences the formation of the ions within plasma ion source 10 by constraining the orbits of the electrons and increasing the likelihood of ionizing atoms of silicon. This external magnetic field permits the electrical discharge to operate at lower gas pressure than could be used without the magnetic field.

The generation of an ionized plasma usually can occur through a neutral gas such as argon, hydrogen, or helium, or through a more active gas, such as nitrogen or oxygen or a mixture thereof, introduced via line 12. The ions produced in this source deposition chamber in turn bombard the cathode (electrodes 14 and 15) and sputter or vaporize atoms of material into a discharge space where they can be ionized. Thus, in the plasma ion source 10, there is produced a plasma which contains large concentrations of ions of the species that one wishes to deposit upon substrate 22.

Many times it is desirous to obtain mixtures of ions such as aluminum and oxygen, silicon and oxygen, or silicon and nitrogen, for the deposition of insulating layers, such as aluminum oxide, silicon dioxide, or silicon nitride. There are generally two different approaches. One approach is to use electrode material fabricated of silicon or aluminum and to introduce the necessary oxygen or nitrogen gas into the plasma by means of the appropriate gas feed line 12 for the maintenance of this ion plasma. There may be difficulty, however, with this approach since adjusting the partial pressures of the oxygen or nitrogen in order to obtain the correct film stochiometry appears to be difficult. An alternative way, which appears to be advantageous is to fabricate the electrode material of the necessary materials, such as silicon oxide or nitride. One then introduces the correct mixture into the plasma source by operating a glow discharge between the two electrodes in the ion source chamber 10. Consideration of other types of films is taken up later after a discussion of the operation of the deposition chamber.

The next occurence in the operation of the apparatus is the extraction of the plasma discharge from the plasma ion source 10 into vacuum deposition chamber 20 where the substrate 22 is located. To facilitate this, an anode extraction electrode 24 is located in deposition chamber 20 along with a constrictor electrode 26. The purpose of constrictor electrode 26 is basically to separate the higher pressure sputtering source chamber 10 from the lower pressure film deposition chamber 20. The ions are extracted through the constrictor electrode 26 by means of the externally applied electric field, which maintains a discharge between the plasma source 10, operated as a cathode, and the extractor anode 24, located in deposition chamber 20. Anode supply 36 facilitates the foregoing by biasing the anode positively with reference to the source 10. The external electric field generated by power supply 36 is oriented along the external magnetic field caused by magnetic coil 30 so that the plasma is extracted along magnetic field lines. This serves to maintain the plasma in a constricted mode so that it is able to pass through the aperture 26A in constrictor electrode 26 more efficiently. Anode electrode 24 acts to extract electrons from the plasma source, and the electric field generated by the extracted electrons pulls the positive ions from plasma source 10 along with them. The anode 24 has an aperture 24A in it located along the axis determined by the magnetic field produced by magnetic coil 30, and this in turn serves to maintain the plasma constriction and permits a large fraction of the extracted positive ions to pass through the anode aperture, subsequently impinging on substrate 22. The apertures in the electrodes 24 and 26 permit differential pumping to occur, thereby maintaining a good vacuum (about $10^{-6}$ Torr) in deposition chamber 20 (provided via vacuum line 29), while somewhat higher pressure is maintained in plasma ion source 10. It is often desirable to surround the apertures in electrodes 24 and 26 with the same material as that to be deposited on the substrate. Note that the magnetic field serves three purposes: In the plasma ion source it permits the source to operate at lower pressures; it aids in constricting the plasma through the constrictor electrode; and it helps to maintain the plasma in a constricted path on its way to the substrate.

The constrictor electrode 26 may be left essentially electrically floating through a high impedance resistor 46 to an appropriate potential such as the one determined by the resistors 40 and 42. For the embodiment of FIG. 1, this potential is intermediate between the potential of the cathode in source 10 and the anode in chamber 20. Similarly, the insulating shield 17, positioned between electrodes 14 and 20, may be left floating. Shield 17 minimizes the tendency of the discharge to attach other than where desired. A focusing electrode 19 can also be used between anode 24 and substrate 22. Electrode 19 is shown connected to anode 24, but can be connected to a separate biasing supply if desired thereby controlling the final path of the ion beam.

The potential on substrate 22 relative to that of plasma ion source 10 and extractor anode 24 determines in large part of the kinetic energy with which the positive ions impinge on substrate 22. Reference is directed to substrate supply 50 which connects via the secondary winding of transformer 52 to substrate 22.

The combination of the DC power supply 50 with the by-pass capacitor 51 permits a DC bias to be applied to the substrate while maintaining the power supply at a low impedance relative to ground. An AC or RF voltage is superimposed on the DC bias voltage by means of oscillator 54 and transformer 52. The use of the transformer permits the application of an additional AC voltage without modifying the DC bias voltage provided by the DC supply 50.

As previously mentioned, the axial magnetic field helps maintain the ion beam in a columnated mode after it is extracted through the aperture in anode 24 and minimizes space charge spreading. In this way, one can achieve a higher deposition rate than would otherwise be expected in the absence of a magnetic columnating field.

There are some modifications of the deposition system of the present invention that will enable the deposition of either conducting films on insulating substrates or depositing insulating films on conducting or insulating substrates. The necessity for these modifications relates to the fact that when depositing an insulating substrate of film it is more difficult to control the energy of the ions impinging on the substrate 22, and therefore is necessary to prevent the surface from building up to a positively charged repelling condition. In the present invention, as shown in FIG. 1, this has been remedied by using an rf power supply 54.

The AC or rf supply, which connects via transformer 52 to substrate 22, operates at a high frequency (at about 15Kc or 13 megacycles, for example) and is used to alternately bias the substrate surface positive and negative by using the displacement current that flows through the insulating film or substrate. The alternating positive and negative potential applied to the substrate is used to extract positive ions and electrons from the plasma so that the net current to the surface is zero; but at the same time, during portions of the cycles, positive ions can be attracted to the surface. The rf amplitude applied to the substrate determines the energy of the positive ions attracted to the surface and can be used to control the deposition energy.

FIG. 2 shows a partial view of the system of FIG. 1 which has been adapted for practising another embodiment of the invention. A vaporizing source 62 and associated power source 60 are added to the configuration of FIG. 1. Source 62 is located in chamber 20 near to substrate 22. In practising this embodiment of the invention, the introduction of energy into the surface atoms of the vaporizing source is primarily to effect vaporization, with the energy to effect deposition on the substrate being primarily supplied by an energetic beam of gaseous ions. This can be accomplished by using an argon beam, for example, generated from the plasma source in conjunction with a source of atoms to be deposited and located in chamber 20. Thus, an energetic beam of gaseous ions, such as argon or another inert gas, coimpinge on the substrate surface with atoms from source 62. Within one or two collisions the high kinetic energy of the argon ion beam is transferred to the lower energy neutral film atoms to be deposited on the substrate surface and gives them the necessary mobility so that they can nucleate and form an improved film. For example, with the embodiment of FIG. 2 one could deposit silicon films on a substrate by means of thermal vaporization of silicon from source 62, concurrently with impingement on the surface of a high energy argon beam, for example. This beam should provide the necessary kinetic energy to transfer to the silicon atoms by means of argon-silicon collisions on the surface.

Source 62 is shown schematically but can be any one of various types of sources of atoms. For example, source 62 may be a sputtering source, a crucible-type vaporization source or even a resistively heated ribbon.

There are other ways that a deposition material can be introduced into the source plasma. One is by sputtering of material from the electrodes 14 and 15, of FIG. 1. Thus, a silicon electrode would be used for the deposition of silicon films, while a carbon electrode would be used for the deposition of carbon films. metallic electrodes, of course, can be used for the deposition of metallic films. An alternative way of introducing the deposition material into the plasma at a much faster rate is by the introduction of the deposition material in the vapor or gaseous form or as a component of a gaseous additive material and the subsequent decomposition of the gaseous additive material into the appropriate ions by means of the energy of the plasma. This is a form of plasma pyrolysis. The use of a hydrocarbon gas, for example, in chamber 10 can permit the deposition of carbon films on the substrate since the ions exiting from the ion source will consist of carbon ions and of hydrogen ions. The hydrogen ions incident on the substrate will help to remove residual oxygen ions that may be on the substrate and thus, enhance the subsequent deposition of the carbon ions.

The use of this ion deposition technique has shown, for example, that insulating films of carbon can be deposited with material properties very similar to that of carbon in the diamond form. The observed points of similarity between the ion beam deposited carbon form and a diamond-like material consists of the following: (1) high index of refraction, (2) high electrical resistivity, (3) transparency in the visible range, (4) high dielectric constant, (5) ability to scratch glass. These insulating carbon films also show a high resistance to hydrofluoric acid etching. One advantage of insulating carbon films is that such films are quite resistant to sodium ion diffusion through these films which occurs at elevated temperatures. This is in agreement with what would be expected for a densely packed diamond-like carbon structure which has densely packed grain boundaries and resists the motion of relatively large alkali ions. Stable insulating and semiconductor carbon films can therefore be produced by this technique and it is expected that the techniques of the invention will find widespread use in the semiconductor field.

Mixtures of gases or vapors can also be used to deposit various film compounds. For example, tungsten and carbon mixtures or compounds thereof can be deposited in the tungsten carbide form by using either tungsten and carbon electrodes or, for more rapid deposition by introducing a tungsten compound in the gaseous form and a hydrocarbon compound in the gaseous form into the plasma ion source region.

Apparatus similar to that shown in FIG. 1 can be used to deposit a carbon-diamond film. The electrodes 14 and 15 may be made of carbon, and the mixture gas may be methane for example (a hydro-carbon gas). The carbon ions are introduced into a plasma from ion source 10 by sputtering from the electrodes themselves or from the gas.

By means of the acceleration potential applied to the substrate, it is possible to have the ions come in with a moderately high kinetic energy (about 100 electron volts for example). As a result of this large kinetic energy of the incident ions, these ions when they strike the deposition surface retain a very high surface mobility and can move about to nucleate into a single crystal structure. At the same time, the carbon atoms already on the deposition surface, in the process of scattering the incident ions themselves, will pick up kinetic energy and become mobile. Thus, the incident ion and the first few surface monolayers of the deposition surface are at a relatively high energy compared to that of the basic substrate. These surface atoms retain enough energy so that they can nucleate into a diamond-like single crystal structure.

Therefore, the apparatus of the present invention can be used to deposit various types of films on different substrates and does so by an ion beam technique, wherein the degree and uniformity of deposition are controlled. The apparatus can also be implemented for use with a vapor source, which is usually located in the deposition chamber. Such an arrangement has also been used to supplement the deposition from the ion beam. In other words a beam containing silicon ions could be used with a silicon vapor source. Another film so deposited was molybdenum.

Another feature of the invention is that relatively small layers of diamond-like carbon can be deposited. Usually for carbon to form into a diamond-like crystallographic structure it is necessary that the carbon atoms be in a high temperature, high pressure, environment for a sufficiently long time so that the crystallization into a diamond form can occur. The technique used herein employs an energetic ion beam that does not require high pressures since only a small portion of the carbon is heated to a high temperature at one time.

Having described some of the features, objects and advantages of the invention, other modifications of and departures from the embodiments disclosed herein will become apparent to those skilled in the art all of which are contemplated as falling within the spirit and scope of the invention and are to be limited solely by the appended claims.

What is claimed is:

1. A method for depositing a film on a substrate comprising the steps of:
   a. generating an energetic beam of gaseous ions, which may be of the same material as the film to be deposited, by means of a glow discharge ion source;
   b. producing a pressure differential between said glow discharge ion source and a deposition chamber containing therein the substrate on which the film is to be deposited together with a source of deposition atoms of the same material as the film to be deposited; and,
   c. directing said energetic beam of gaseous ions into said deposition chamber such that the beam of ions impinges concurrently upon the substrate and said source of deposition atoms and thereby deposits a film of the deposition material on the substrate.

2. The method of claim 1 wherein said energetic beam of gaseous ions includes ions of an inert gas.

3. The method of claim 2 wherein said inert gas includes argon.

4. The method of claim 1 wherein said source of deposition atoms includes silicon atoms.

5. A method for depositing a film on a substrate comprising the steps of:
   a. generating an energetic beam of gaseous ions in a gas-containing chamber by means of establishing a sufficient electrical potential between at least two spaced electrodes, of which at least one of said electrodes is at least partly formed of the material which is to be deposited, so as to cause a glow discharge therebetween which releases atoms of the material which is to be deposited from said electrode at least partly formed of said material and ionizes said released deposition material atoms to form ions thereof;
   b. producing a pressure differential between said gas-containing chamber and a deposition chamber containing therein the substrate on which the film is to be deposited;
   c. extracting said gaseous ions from said gas-containing chamber by means of an extraction electrode having an aperture disposed therein and containing said ions by means of an axial magnetic field between said gas-containing chamber and said deposition chamber with the axis of the magnetic field being substantially parallel to the axis of said extraction electrode aperture; and,
   d. accelerating at least some of said gaseous ions and directing them into said deposition chamber so as to impinge upon said substrate thereby depositing a film on the substrate.

6. The method of claim 5 further comprising the step of applying an electrical potential between at least one of said spaced electrodes and said substrate contained within said deposition chamber.

7. The method of claim 6 wherein said electrical potential is an AC voltage.

8. The method of claim 5 wherein the gas maintained within said gas-containing chamber is capable of supplying a portion of the material which is to be deposited after becoming ionized in said gas-containing chamber.

9. The method of claim 8 wherein said material to be deposited is carbon and wherein at least one gas within the gas-containing chamber contains carbon as a constituent thereof.

10. The method of claim 9 wherein said gaseous ions are carbon ions and the film deposited on the substrate is a film of carbon having diamond-like characteristics.

11. The method of claim 10 wherein said ions are carbon ions and the film deposited on the substrate is a carbon film having the characteristics of a high index of refraction, high electrical resistivity, transparency in the visual range, a high dielectric constant and the ability to scratch glass.

12. A method for depositing a film on a substrate comprising the steps of:
   a. generating an energetic beam of gaseous ions in a gas-containing chamber, wherein said chamber contains at least one gas capable of supplying a portion of the material which is to be deposited, by means of establishing a sufficient electrical potential between at least two spaced electrodes so as to cause a glow discharge therebetween which ionizes said gas capable of supplying a portion of the material which is to be deposited to form ions thereof;
   b. producing a pressure differential between said gas-containing chamber and a deposition chamber containing therein the substrate on which the film is to be deposited;
   c. extracting said gaseous ions from said gas-containing chamber by means of an extraction electrode having an aperture disposed therein and containing said ions by means of an axial magnetic field between said gas-containing chamber and said deposition chamber with the axis of the magnetic field being substantially parallel to the axis of said extraction electrode aperture; and,
   d. accelerating at least some of said gaseous ions and directing them into said deposition chamber so as to impinge upon said substrate thereby depositing a film on the substrate.

13. The method of claim 12 further comprising the step of applying an electrical potential between at least one of said spaced electrodes and said substrate contained within said deposition chamber.

14. The method of claim 13 wherein said electrical potential is an AC voltage.

15. The method of claim 12 wherein said material to be deposited is carbon and wherein at least one gas within said gas-containing chamber contains carbon as a constituent thereof.

16. The method of claim 15 wherein said material which is to be deposited is carbon and at least one of said spaced electrodes is formed of carbon.

17. The method of claim 15 wherein said gaseous ions are carbon ions and the film deposited on the substrate is a film of carbon having diamond-like properties.

18. The method of claim 17 wherein said ions are carbon ions and the film deposited on the substrate is a carbon film having the characteristics of a high index of refraction, high electrical resistivity, transparency in the visual range, a high dielectric constant and the ability to scratch glass.

19. The method of claim 12 wherein said pressure differential between the gas-containing chamber and the deposition chamber is produced by constrictor electrode means having an aperture disposed therein through which said beam of gaseous ions can pass.

20. The method of claim 19 wherein said constrictor electrode means aperture and said extraction electrode aperture are lined with a material which is the same as the material which is to be deposited.

21. The method of claim 19 further characterized by the use of an electrically insulating shield means positioned between said spaced electrodes and said constrictor electrode means, said shield means having an aperture disposed therein through which said ions flow.

22. The method of claim 21 wherein said shield means aperture, and constrictor electrode means aperture, and said extraction electrode aperture are lined with a material which is the same as the material which is to be deposited.

* * * * *